(12) United States Patent
Bevington et al.

(10) Patent No.: US 12,044,756 B2
(45) Date of Patent: Jul. 23, 2024

(54) METHOD AND SYSTEM FOR GENERATION OF ATOMIC SPIN ORIENTATION

(71) Applicants: NPL MANAGEMENT LIMITED, Teddington (GB); THE UNIVERSITY OF STRATHCLYDE, Glasgow Central Scotland (GB)

(72) Inventors: Patrick Bevington, Glasgow Central Scotland (GB); Rafal Gartman, Teddington (GB); Witold Chalupczak, Teddington (GB)

(73) Assignees: NPL MANAGEMENT LIMITED (GB); THE UNIVERSITY OF STRATHCLYDE (GB)

( * ) Notice: Subject to any disclaimer, the term of this patent is extended or adjusted under 35 U.S.C. 154(b) by 0 days.

(21) Appl. No.: 17/766,926

(22) PCT Filed: Oct. 6, 2020

(86) PCT No.: PCT/GB2020/052464
§ 371 (c)(1),
(2) Date: Apr. 6, 2022

(87) PCT Pub. No.: WO2021/069880
PCT Pub. Date: Apr. 15, 2021

(65) Prior Publication Data
US 2024/0085501 A1 Mar. 14, 2024

(30) Foreign Application Priority Data
Oct. 7, 2019 (GB) .................................. 1914464

(51) Int. Cl.
*G01R 33/26* (2006.01)
(52) U.S. Cl.
CPC .................. *G01R 33/26* (2013.01)

(58) Field of Classification Search
CPC ...................................................... G01R 33/26
See application file for complete search history.

(56) References Cited

U.S. PATENT DOCUMENTS

2009/0243610 A1* 10/2009 Ichihara ................. G01R 33/26
324/304
2013/0207649 A1 8/2013 Mizutani et al.
(Continued)

FOREIGN PATENT DOCUMENTS

WO 2009079054 A2 6/2009
WO 2020016557 A1 1/2020

OTHER PUBLICATIONS

Skolnik et al. "Optical pumping of Zeeman components in the rubidium vapor", Optics Communication, 282 (2009) 1326-1334. (Year: 2009).*

(Continued)

*Primary Examiner* — G. M. A. Hyder
(74) *Attorney, Agent, or Firm* — Dickinson Wright PLLC

(57) ABSTRACT

Disclosed is a method of generating atomic spin orientation in an atomic ensemble. The method includes providing a steady magnetic field (5) to the atomic ensemble to cause a Zeeman splitting within first and second manifolds of the ground state of the atomic energy levels of the atomic ensemble. The method includes pumping the atomic ensemble with an electromagnetic optical radiation beam, the beam being detuned from a transition involving the first manifold such that a majority of the atomic population of the first manifold in the atomic ensemble is transferred from the first manifold into a magnetic Zeeman sublevel of the second manifold. A system for generating an atomic spin orientation in a 15 atomic ensemble is also disclosed.

20 Claims, 11 Drawing Sheets

(56) References Cited

U.S. PATENT DOCUMENTS

| | | | |
|---|---|---|---|
| 2013/0278253 A1 | 10/2013 | Ichihara et al. | |
| 2014/0320123 A1 | 10/2014 | Kobayashi et al. | |
| 2015/0316625 A1* | 11/2015 | Bulatowicz | G01R 33/3875 324/321 |
| 2016/0116553 A1* | 4/2016 | Kim | G01R 33/032 324/304 |

OTHER PUBLICATIONS

Communication Pursuant to Article 94(3) EPC for European Application No. 20801351.6, dated Sep. 12, 2023, 6 pages.
International Search Report and Written Opinion for PCT Application No. PCT/GB2020/052464, dated Feb. 1, 2021, 12 pages.
International Preliminary Report on Patentability for PCT Application No. PCT/GB2020/052464, dated Apr. 12, 2022, 8 pages.
Examination Report for British Application No. GB1914464.4, dated Nov. 12, 2021, 1 page.
Combined Search and Examination Report for British Application No. GB1914464.4, dated Apr. 7, 2020, 9 pages.
Li et al., "Miniature quad-channel spin-exchange relaxation-free magnetometer for magnetoencephalography," Chin. Phys. B, vol. 28, No. 4, 2019, 5 pages.
Nafcha et al., "Complete atomic orientation via linearly polarized optical pumping," Optics Communications 90, Jun. 1, 1992, pp. 51-56, Elsevier Science Publishers B.V.
Skalla et al., "Magnetic resonance line shapes in optical pumping and light-shift experiments in alkali atomic vapors," Journal of the Optical Society of America B, vol. 12, No. 5, May 1995, pp. 772-781.
Budker et al., "Resonant nonlinear magneto-optical effects in atoms," arxiv Org., Sep. 13, 2002, pp. 1-51, Cornell University Library, Ithaca, NY.
Bevington et al., "Imaging of material defects with a radio-frequency atomic magnetometer," Review of Scientific Instruments, vol. 90, No. 1, Jan. 7, 2019, 7 pages, AIP Publishing, Melville, NY, US.
Awschalom et al., "Quantum technologies with optically interfaced solid-state spins," Nat. Photonics, vol. 12, Sep. 2018, pp. 516-527.
Smith et al., "Quantum Control in the Cs 6S1/2 Ground Manifold Using Radio-Frequency and Microwave Magnetic Fields," Phys. Rev. Lett., vol. 111, No. 170502, Oct. 25, 2013, 5 pages, The American Physical Society.
Chalopin et al., "Quantum-enhanced sensing using non-classical spin states of a highly magnetic atom," Nat. Commun., vol. 9, No. 4955, 2018, 8 pages.
Happer et al., "Optical Pumping," Rev. Mod. Phys., vol. 44, No. 2, Apr. 1972, 82 pages.
Fortson et al., "Spontaneous Spin Polarization and Bistability in Atomic Vapors by Optical Pumping with Unpolarized Light," Phys. Rev. Lett., vol. 59, No. 12, Sep. 21, 1987, pp. 1281-1284, The American Physical Society.
Klipstein et al., "Observation of Spontaneous Spin Polarization in an Optically Pumped Cesium Vapor," Phys. Rev. Lett., vol. 76, No. 13, Mar. 25, 1996, pp. 2266-2269, The American Physical Society.
Andalkar et al., Experimental and theoretical study of spontaneous spin polarization and hysteresis in cesium vapor, Phys. Rev. A, vol. 65, No. 023407, 2002, The American Physical Society.
Wasilewski et al., "Quantum noise limited and entanglement-assisted magnetometry," Phys. Rev. Lett., vol. 104, No. 133601, Apr. 2, 2010, 4 pages, The American Physical Society.
Walker et al., "Spin-exchange optical pumping of noble-gas nuclei," Rev. Mod. Phys., vol. 69, No. 2, Apr. 1997, pp. 629-642, The American Physical Society.
Appelt et al., "Theory of spin-exchange optical pumping of 3He and 129Xe," Phys. Rev. A, vol. 58, No. 2, Aug. 1998, pp. 1412-1439, The American Physical Society.
Smith et al., "Continuous Weak Measurement and Nonlinear Dynamics in a Cold Spin Ensemble," Phys. Rev. Lett., vol. 93, No. 16, Oct. 15, 2004, 4 pages, The American Physical Society.
Chalupczak et al., "Alkali-Metal Spin Maser," Phys. Rev. Lett., vol. 115, No. 3, Jul. 17, 2015, 5 pages, The American Physical Society.
Budker et al., "Nonlinear Magneto-optical Rotation via Alignment-to-Orientation Conversion," Phys. Rev. Lett., vol. 85, No. 10, Sep. 4, 2000, pp. 2088-2091, The American Physical Society.
Kuntz et al., "Dynamic Stark shift and alignment-to-orientation conversion," Phys. Rev. A, vol. 65, No. 2, 2002, 8 pages, The American Physical Society.
Rochester et al., "Orientation-to-alignment conversion and spin squeezing," Phys. Rev. A, vol. 85, No. 2, 2012, 7 pages, The American Physical Society.
Auzinsh et al., "Optically Polarized Atoms, Understanding Light-Atom Interactions," Oxford, 2010, 389 pages, Oxford University Press.
Ruff et al., "Spin-Exchange Light Modulation by Atomic Hydrogen," Phys. Rev. Lett., vol. 15, No. 7, Aug. 16, 1965, pp. 2882-2884.
Haroche et al., "Resonant Transfer of Coherence in Nonzero Magnetic Field Between Atomic Levels of Different g Factors," Phys. Rev. Lett., vol. 24, May 4, 1970, pp. 974-979.
Skalla et al., "Coherence transfer between atomic transitions of different g-factor by modulated optical excitation," Opt. Commun., vol. 127, Feb. 5, 1996, pp. 31-36, Elsevier Science B.V.
Chalupczak et al., "Spin-exchange narrowing of the atomic ground-state resonances," Phys. Rev. A, vol. 90, No. 4, 2014, 5 pages, The American Physical Society.
Savukov et al., "Tunable Atomic Magnetometer for Detection of Radio-Frequency Magnetic Fields," Phys. Rev. Lett., vol. 95, No. 6, Aug. 5, 2005, 4 pages, The American Physical Society.
Chalupczak et al., "Radio-Frequency Spectroscopy as a Tool for Studying Coherent Spin Dynamics and for Application to Radio-Frequency Magnetometry," Advances in At. Mol. and Opt. Phys., vol. 67, 2018, pp. 297-336, Elsevier Inc.
Bevilacqua et al., "Simultaneous Detection of H and D NMR Signals in a micro-Tesla Field," J. Phys. Chem. Lett., vol. 8, No. 24, pp. 6176-6179.
Wickenbrock et al., "Magnetic induction tomography using an all-optical 87Rb atomic magnetometer," Opt. Lett., vol. 39, No. 22, Nov. 15, 2014, pp. 6367-6370, Optical Society of America.
Bevington et al., "Enhanced material defect imaging with a radio-frequency atomic magnetometer," J. Appl. Phys., vol. 125, Mar. 1, 2019, 9 pages, AIP Publishing.
Chalupczak et al., "Enhancement of optically pumped spin orientation via spin-exchange collisions at low vapor density," Phys. Rev. A, vol. 85, 2012, 8 pages.
Takahashi et al., "Quantum nondemolition measurement of spin via the paramagnetic Faraday rotation," Phys. Rev. A, vol. 60, No. 6, Dec. 1999, pp. 4974-4979, The American Physical Society.
Ledbetter et al., "Spin-exchange-relaxation-free magnetometry with Cs vapor," Phys. Rev. A, vol. 77, No. 3, 2008, 7 pages, The American Physical Society.
Chalupczak et al., "Room temperature femtotesla radio-frequency atomic magnetometer," Appl. Phys. Lett., vol. 100, No. 24, Jun. 12, 2012, 5 pages.
Bevilacqua et al., "Multichannel optical atomic magnetometer operating in unshielded environment," Appl. Phys. B, vol. 122, No. 103, Apr. 12, 2016, 9 pages.
Chalupczak et al., "Optical-radio-frequency resonances free from power broadening," Phys. Rev. A, vol. 81, No. 1, 2010, 6 pages, Springer-Verlag Berlin Heidelberg.
Happer et al., "Effect of rapid spin exchange on the magnetic-resonance spectrum of alkali vapors," Phys. Rev. A, vol. 16, No. 5, Nov. 1977, 15 pages.

* cited by examiner

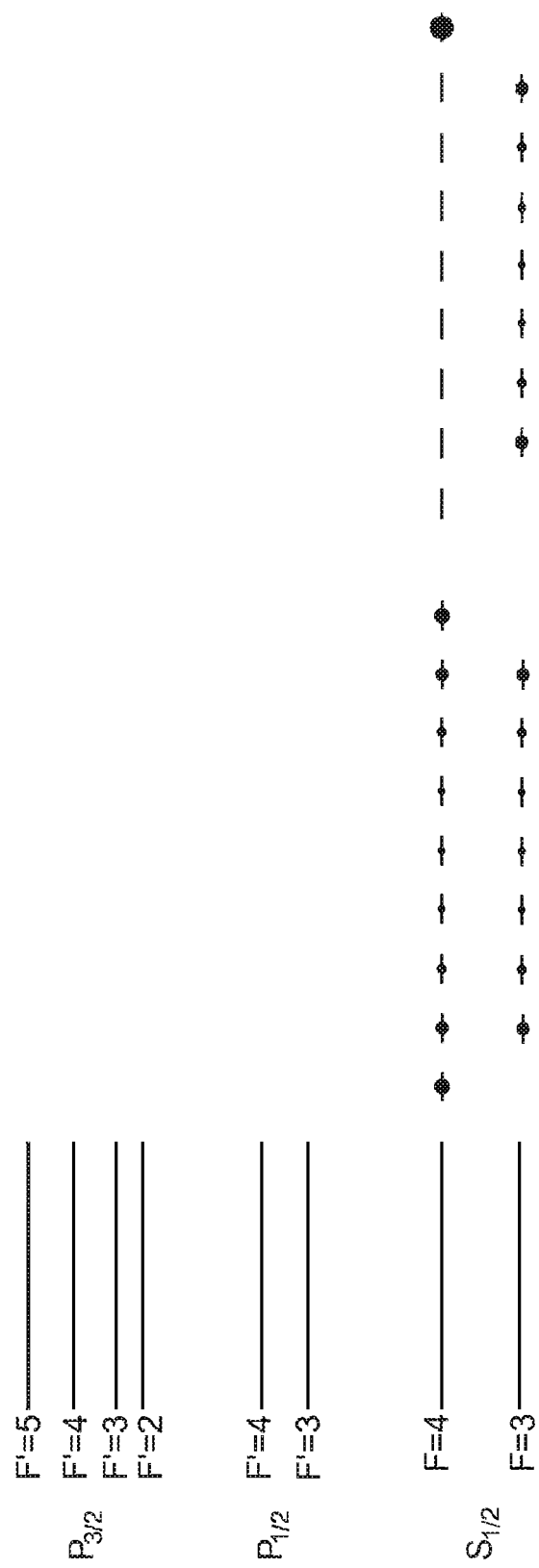

METHOD AND SYSTEM FOR GENERATION OF ATOMIC SPIN ORIENTATION

CROSS-REFERENCE TO RELATED APPLICATIONS

This application claims priority to and the benefit of PCT Patent Application No. PCT/GB2020/052464, filed on 6 Oct. 2020, entitled "METHOD AND SYSTEM FOR GENERATION OF ATOMIC SPIN ORIENTATION" and GB Patent Application No. 1914464.1, filed on 7 Oct. 2019, entitled "METHOD AND SYSTEM FOR GENERATION OF ATOMIC SPIN ORIENTATION."

BACKGROUND

The present invention relates to methods and systems for generating atomic spin orientation.

The generation of spin polarization is an important step in the study and application of a large variety of systems, from solid-state samples to cold atomic ensembles. In the atomic physics domain, the standard method (optical pumping) relies on the transfer of angular momentum from polarized light to the atomic system. While a typical scheme involves the interaction of an atomic sample with a circularly polarized laser beam propagating along a static magnetic field, other configurations, including different polarization and number of lasers, have been demonstrated. Optical pumping also covers the transfer of optical angular momentum to the target atoms achieved via spin-exchange collisions (SEC). Another category of spin polarization processes combines optical pumping with non-linear spin dynamics. One particular realization, the so-called alignment to orientation conversion, involves the evolution of the population imbalance in mutually orthogonal magnetic and electric fields. In this way, tensor polarization (alignment), where the spins are aligned along a preferred axis but no preferred direction, can be transformed into a vector polarization, (orientation) where spins are biased in one direction.

Aspects of the present invention seek to provide an improved method and system for generating atomic spin orientation.

According to an aspect of the invention, there is provided a method of generating atomic spin orientation in an atomic ensemble, including:
providing a steady magnetic field to the atomic ensemble to cause a Zeeman splitting within first and second manifolds of the ground state of the atomic energy levels of the atomic ensemble;
pumping the atomic ensemble with an electromagnetic optical radiation beam, the beam being detuned from a transition involving the first manifold such that a majority of the atomic population of the first manifold in the atomic ensemble is transferred from the first manifold into a magnetic Zeeman sublevel of the second manifold.

In some embodiments, the beam is detuned from a transition involving the first manifold such that a majority of the atomic population of the first manifold in the atomic ensemble is transferred from the first manifold into a magnetic Zeeman sublevel of the second manifold with a maximum or minimum magnetic quantum number.

In some embodiments, the optical radiation power of the beam exceeds a threshold power to cause asymmetry in the distribution of the atomic population of Zeeman sublevels of the second manifold so as to create an atomic spin orientation.

In some embodiments, the threshold power is a power at which a dependence on optical radiation beam power of a magneto-optical-rotation signal of the atomic ensemble becomes non-linear. The skilled person will appreciate that the magneto-optical-rotation signal can be obtained from a detection of the beam after it has passed through the atomic ensemble, preferably when the ensemble is subject to an oscillating magnetic field. The signal can relate to amplitude of the oscillations of the beam polarization. As the skilled person will appreciate, a magneto-optical-signal arises from a coupling produced by an oscillating magnetic field between Zeeman sublevels in an atomic ensemble that is subjected to a steady magnetic field.

In some embodiments, the threshold power is 2 mW.

In some embodiments, the steady magnetic field is configured to result in a Larmor frequency in the atomic ensemble of no more than 30 kHz.

In some embodiments, the steady magnetic field is configured to result in a Larmor frequency in the atomic ensemble of no more than 20 kHz.

In some embodiments, a frequency of the beam is a frequency which maximizes a magneto-optical-rotation signal from the second manifold.

In some embodiments, the beam is negatively detuned from the transition involving the first manifold.

In some embodiments, the beam has linear polarization. In other embodiments, the beam has circular polarization. Preferably, the circularly polarized beam is (or is substantially) parallel to the steady magnetic field.

In some embodiments, the steady magnetic field is configured to result in a Larmor frequency in the atomic ensemble of greater than 20 kHz.

According to an aspect of the invention, there is provided a method of detecting an oscillating magnetic field including the method above where the beam has linear polarization, including detecting the beam after it has passed through the atomic ensemble in order to detect an oscillating magnetic field.

According to an aspect of the invention, there is provided a method of detecting an oscillating magnetic field including the method above where the beam has circular polarization, wherein the beam is a magnetometer pump beam, the method including probing the atomic ensemble with a magnetometer probe beam having linear polarization and being degenerate with the magnetometer pump beam in terms of frequency, the method including detecting the magnetometer probe beam after it has passed through the atomic ensemble in order to detect an oscillating magnetic field.

In some embodiments, the method includes providing an oscillating primary magnetic field to cause an electrically conductive or magnetically permeable object to produce a secondary magnetic field.

For any of the aspects above, the polarization of the linearly polarized beam is preferably parallel or substantially parallel to the steady magnetic field. The linearly polarized beam can be transverse and preferably orthogonal to the steady magnetic field direction and can be transverse and preferable orthogonal to an oscillating magnetic field for detection.

According to an aspect of the invention, there is provided a system for generating an atomic spin orientation in an atomic ensemble, including:
an atomic ensemble having atomic energy levels including a ground state including first and second manifolds;
a radiation source configured to pump the atomic ensemble with an electromagnetic optical radiation beam detuned from a transition involving the first manifold such that a majority of the atomic population of the first manifold in the atomic ensemble is transferred from the first manifold into a magnetic Zeeman sublevel of the second manifold.

In some embodiments, the system is configured to provide the beam with an optical radiation power exceeding a threshold power to cause asymmetry in the distribution of the atomic population of Zeeman sublevels of the second manifold so as to create an atomic spin orientation.

In some embodiments, the beam has linear polarization.

In some embodiments, the beam is a pump beam with circular polarization.

In some embodiments, the system includes a radiation source configured to probe the atomic ensemble with a linearly polarized probe beam substantially degenerate with the circularly polarized pump beam in terms of frequency. This may be the same radiation source as used for pumping.

In some embodiments, the radiation source is configured to emit a single beam and the system includes a beam splitter configured to split the single beam into the pump beam and the probe beam.

In some embodiments, the system includes a detector configured to detect the linearly polarized beam in order to detect an oscillating magnetic field.

In some embodiments, the atomic ensemble is rubidium and the radiation source is configured to emit the beam with an optical radiation power of no more than 4 mW.

In some embodiments, the radiation source is a Vertical-Cavity Surface-Emitting Laser diode.

In some embodiments, the system includes a magnetic field source configured to provide a steady magnetic field to the atomic ensemble to cause a Zeeman splitting within first and second manifolds of the ground state of the atomic energy levels of the atomic ensemble.

In some embodiments, the system is an atomic magnetometer.

BRIEF DESCRIPTION OF DRAWINGS

Embodiments of the invention are described below, by way of example only, with reference to the accompanying drawings.

FIGS. 3a, 3b, and 3c are a schematic diagram showing the creation of orientation in the second manifold of an atomic ensemble.

DESCRIPTION OF EMBODIMENTS

Embodiments of the invention, as described below, are able to provide for generation of atomic spin orientation in room-temperature alkali-metal vapor in an efficient manner in some embodiments with a linearly polarized beam.

Conventionally, atomic spin orientation is achieved by the transfer of angular momentum from polarized light to an atomic system.

The measurement configurations discussed below enable simple and robust radio-frequency atomic magnetometers that are based on a single low power laser diode that approach the performance of multi-laser pump-probe systems.

Some embodiments of the invention described below provide a mechanism of orientation generation, for example in room-temperature caesium vapors, that combines three elements: optical pumping, non-linear spin dynamics and spin-exchange collisions. Through the variation of the spin-exchange relaxation rate, the transition between an aligned and an oriented atomic sample is presented. The observation is performed by monitoring the atomic radio-frequency spectra.

Figure 1:
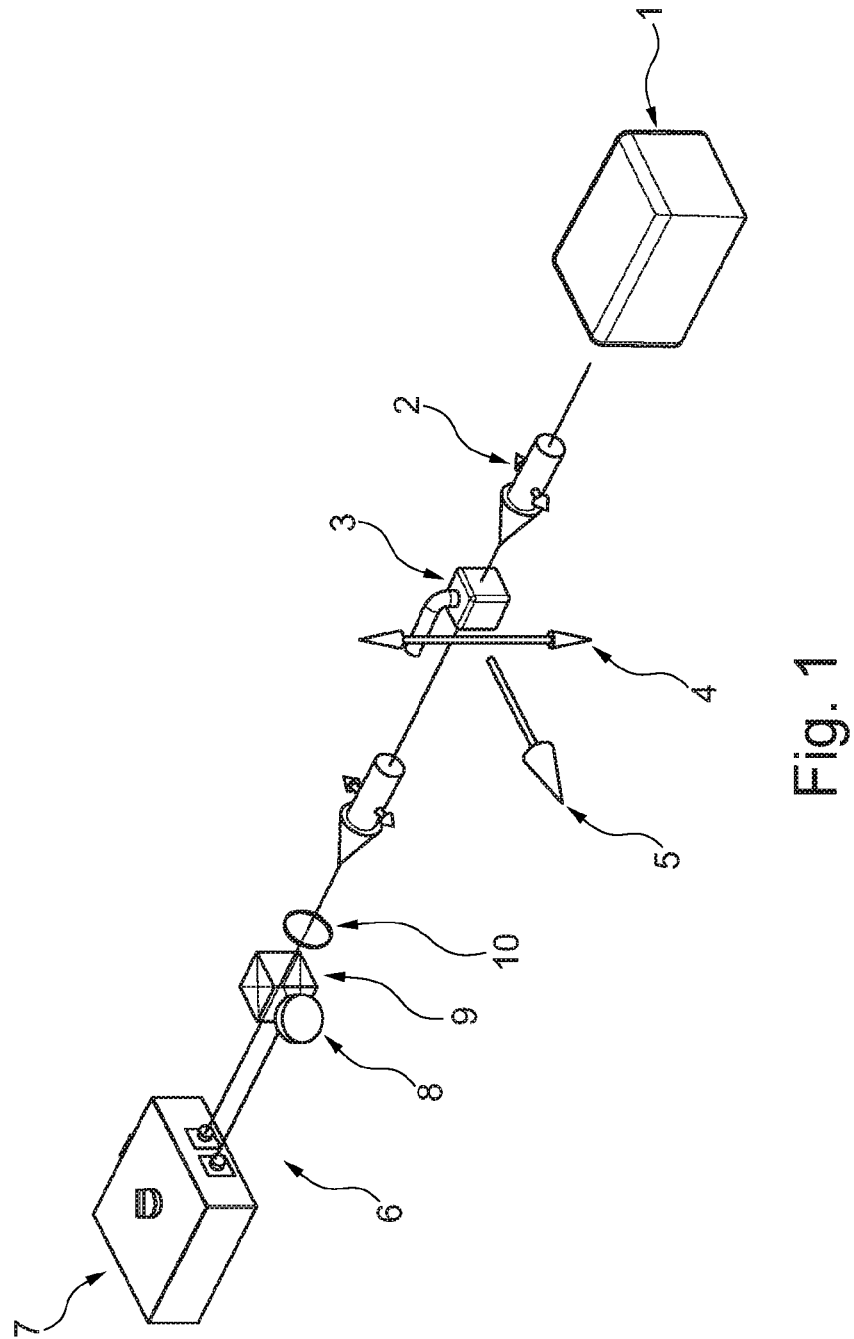
FIG. 1 shows a schematic configuration of a single, linearly polarized beam that creates a population imbalance (polarizes) within an atomic ground state by transferring population between the ground state manifolds. A static bias magnetic field creates an energy splitting within the ground state manifolds. A resonant oscillating magnetic field generates coherences between the ground state manifolds, causing the atomic polarization to precess. This atomic polarization rotation is mapped on to the linearly polarized beam and is detected by a simple polarimeter consisting of a balance photodiode and a polarizing beam splitter.

FIG. 1 shows a radio-frequency atomic magnetometer, which can in some embodiments be tunable. The magnetometer is for use with a primary magnetic field source (not shown) which is configured to provide an oscillating primary magnetic field. The primary magnetic field source is in this embodiment an rf coil; however, other variable magnetic field sources can be used in other embodiments. The rf coil is configured to provide a primary magnetic field substantially orthogonal to a surface of a sample to be investigated. In this embodiment, the surface is the surface under investigation, which is a major surface of the sample.

In this embodiment, the rf coil is a 1000 turn coil with 0.02 mm diameter copper wire, height 10 mm, 2 mm and 4 mm inner and outer diameters. However, the skilled person will appreciate that the dimensions can be varied depending on the application.

The rf coil is configured so that it can be placed adjacent to a sample, but entirely on one side thereof and in a non-overlapping relationship therewith, and can be operated to generate an oscillating primary magnetic field to cause the sample to produce a secondary magnetic field 4, oscillating at the same frequency as the primary magnetic field. The secondary magnetic field is indicative of a material response of the sample.

Samples should be electrically conductive (although not necessarily highly electrically conductive) and/or should have a magnetic permeability such that they can be magnetized.

The atomic magnetometer is configured to detect the secondary magnetic field, for example to perform material defects imaging.

In this embodiment, the atomic magnetometer includes a detection cell 3, which in this embodiment is a 1 cm 3 paraffin coated glass cell at ambient temperature containing an atomic ensemble. In this embodiment, the atomic ensemble is caesium atomic vapor (for which atomic density $n_{Cs}=3.3\times10^{10}$ cm$^{-3}$).

The magnetometer includes a bias magnetic field source (not shown) configured to provide a bias magnetic field 5 at the detection cell 3 and therefore to the atomic ensemble in a bias magnetic field direction. The terms 'bias' and 'offset' are used interchangeably in the context of this magnetic field. The bias magnetic field is a steady or static magnetic field; it may be varied but it is stabilized and non-oscillating. The bias magnetic field is configured to cause a Zeeman splitting within first and second manifolds of the ground state of the atomic energy levels of the atomic ensemble. The strength of the bias fields defines a Larmor frequency.

In this embodiment, the offset magnetic field is actively stabilized by three pairs of nested, orthogonal, square Helmholtz coils. These provide the bias magnetic field source, although other bias magnetic field sources can be used in other embodiments.

The magnetometer includes a radiation source 1, in this embodiment a laser, configured to pump the atoms of the atomic specimen in the detection cell 3 with an electromagnetic optical radiation beam 2 transverse and in this embodiment orthogonal to the bias magnetic field.

The beam 2 is configured to pump the atomic specimen to create an orientation in the atomic ensemble.

The beam 2 also serves as a probe beam to probe the detection cell 3 to probe the atomic ensemble, in particular to probe atomic coherence precession within the atomic ensemble.

The evolution of the collective atomic spin of the atomic ensemble is mapped onto the polarization state of the beam 2.

The atomic magnetometer includes a detector. In this embodiment, the detector includes a balanced polarimeter 6 configured to receive and detect the beam 2 after passing through the atomic ensemble in the detection cell 3 in order to detect an oscillating magnetic field in the region of the atomic ensemble. The polarimeter 6 includes a polarizing beam splitter 9, a half-waveplate 10 configured so that the beam 2 passes through the half-waveplate 10 on its way to the beam splitter 9, a photodiode configured to receive both outputs of the beam splitter 9, one of which is routed from the beam splitter 9 to the photodiode 7 via a mirror 8.

The laser light transmitted through the cell 3 is analyzed by the polarimeter.

The detector is configured to output a detection signal in response to detection of the beam 2. This detection signal is typically a voltage or current signal representing the polarization and/or amplitude of the detected beam 2. The output of the detector is in this embodiment an output of the balanced photodetector providing a voltage signal representing a polarization of the beam 2. The amplitude and phase of the signal can be used, for example by a computer, to detect the secondary magnetic field 4 and thereby a material response of the sample, and in some cases to perform material defects imaging.

Figure 11:
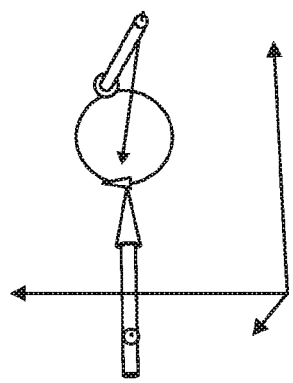
FIGS. 9 to 11 illustrate how the signal of a magnetometer, also referred to as a magneto-optical-rotation signal, is created in three phases.
Figure 10:
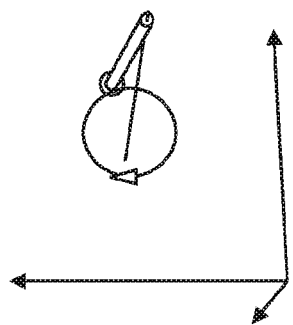
Figure 9:
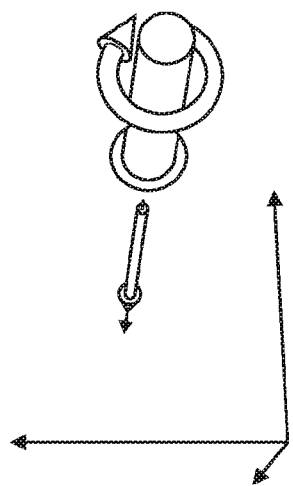

As will be understood by the skilled person, the signal of a magnetometer, also referred to as a magneto-optical-rotation signal, is created in three phases. FIGS. 9 to 11 illustrate this based on the conventional pump and probe beam system. However, as explained herein, in the embodiment under discussion, a single beam plays both of those roles.

First, with reference to FIG. 9, we create atomic population polarization in the atomic ensemble through coupling to the pump beam (or in other terms spin component along the bias magnetic field, which is marked with black arrow in FIG. 9). Although the pump beam is illustrated in FIG. 9 for convenience as being a circularly polarized beam parallel to the bias field, as would be the case in many conventional systems, in the embodiment of FIG. 1 it is the same beam as the probe beam.

With reference to FIG. 10, the oscillating magnetic field (e.g. the secondary field) creates atomic coherences, or in other terms tilts the atomic spin, which causes its precession around the bias field. Spin component perpendicular to the bias field (i.e. atomic coherence) precesses at Larmor frequency that is defined by the strength of the bias magnetic field.

With reference to FIG. 11, oscillations of the atomic spin are monitored by the linearly polarized probe beam.

Figure 12:
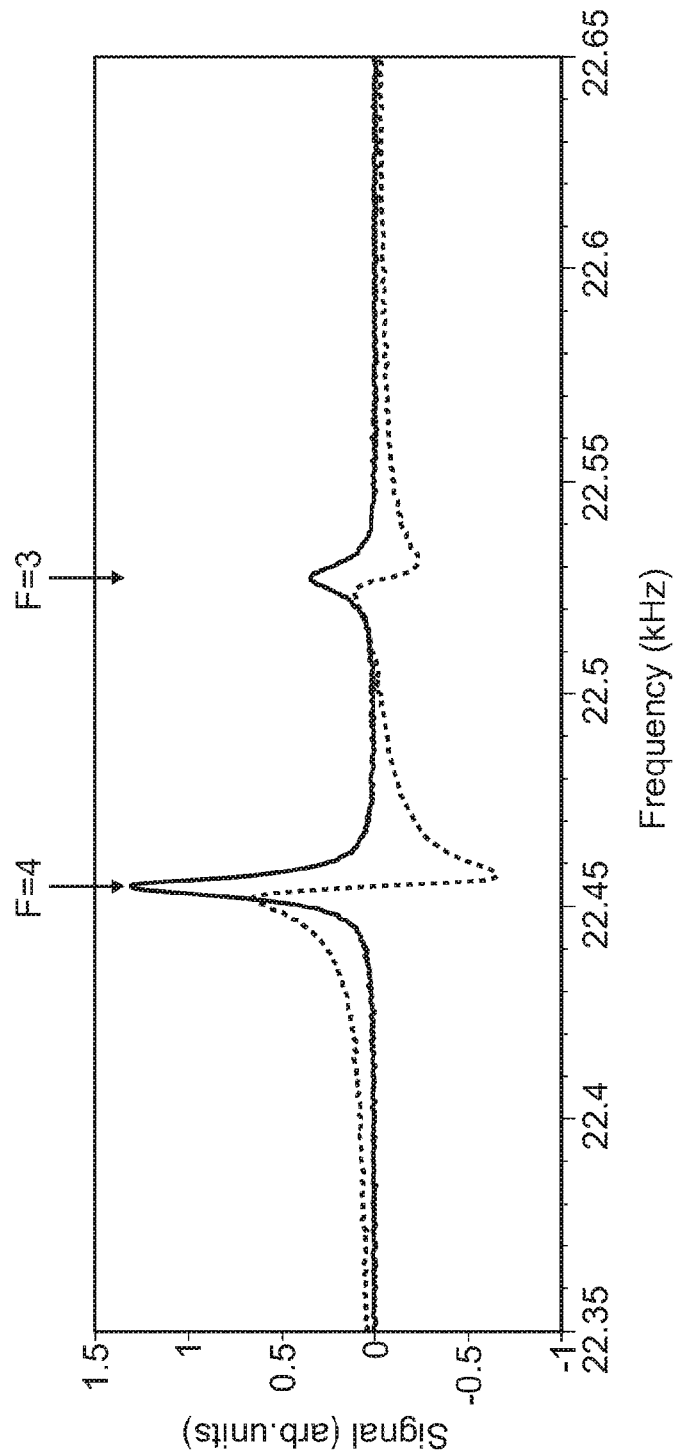
FIG. 12 shows an example of an rf spectrum.

Spin precession is mapped onto the beam polarization, i.e. oscillation of the spin result in oscillation of the beam polarization (Faraday effect). The photodetector records the amplitude of the oscillations at specific driving frequency. Scanning the driving frequency gives us an rf spectrum, otherwise known as the magneto-optical-rotation signal, an example of which is shown in FIG. 12. The F=3 and F=4 spins oscillate at different frequencies (Larmor frequency for the F=3 and F=4 spin is different). It is the amplitude and the phase of the F=4 resonance profile that produces amplitude and phase images in non-destructive tests.

As has been explained above, many conventional magnetometers use a circularly polarized pump beam at a different frequency from a linearly polarized probe beam. In contrast, in the embodiment of FIG. 1, the radiation source 1 is configured to emit a single linearly polarized beam 2 which is used as both pump and probe beam. The polarization of the beam 2 is substantially parallel to the bias magnetic field; the optimum being parallel polarization.

The inventors have discovered that by detuning the beam from a transition involving the first manifold of the ground state of the atomic energy levels of the atomic ensemble, it is possible to transfer a majority of the atomic population of the first manifold in the atomic ensemble from the first manifold to a magnetic Zeeman sublevel of the second manifold of the ground state. Furthermore, the inventors have discovered that for a linearly polarized beam by increasing the optical radiation power of the beam, the symmetry of the distribution in the second manifold is broken above a threshold power and orientation is then obtained in the second manifold.

Population in atomic physics refers to a probability of an occupation of particular energy level within the atomic ensemble. If we say the population of the sublevel with maximum magnetic number is 0.5, it means that on average 50% of atoms within given ensemble occupy that level.

Figure 5:
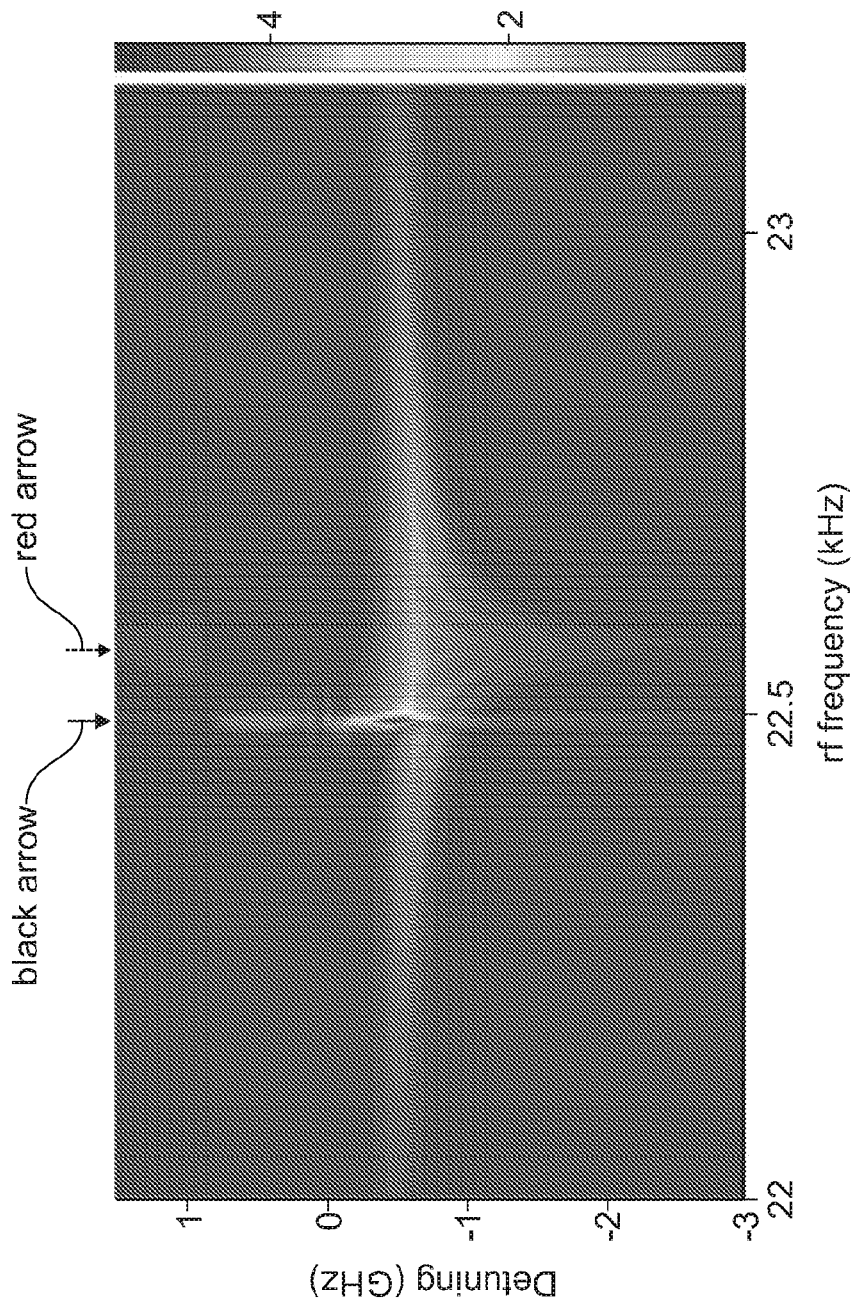
FIG. 5 shows dependence of the rf signal amplitude, R, on the probe beam detuning from the $6^2S_{1/2}F=3 \rightarrow 6^2P_{3/2}F'=2$ transition. The F=3 and F=4 resonances are marked with a red and black arrow respectively. The measurements have been made with a laser beam power of 5.9 mW.
Figure 8A:
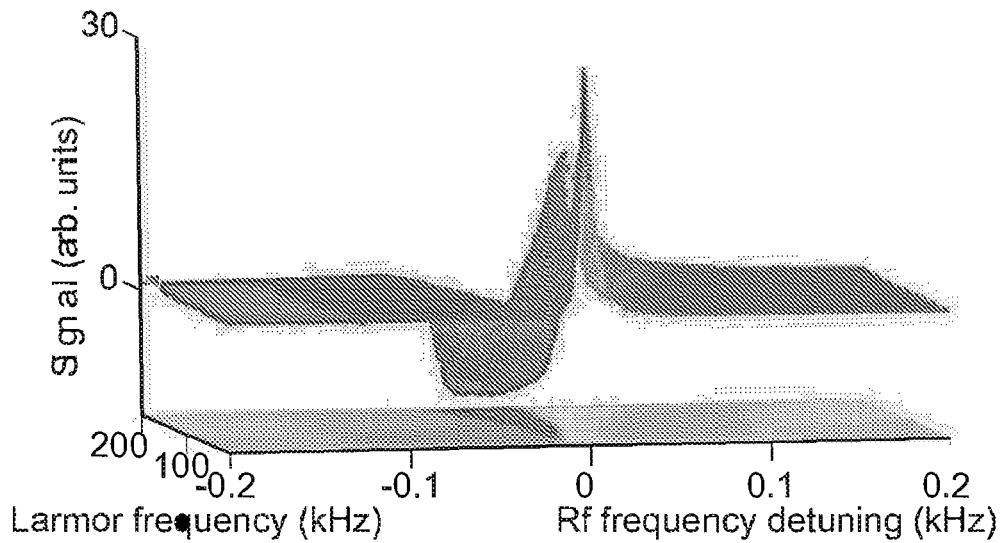
FIG. 8a and 8b shows dependence of the quadrature components of the rf signal amplitude 8a, and phase 8b on the offset magnetic field strength (Larmor frequency). The frequency of the rf spectra is expressed in terms of the detuning from the center of the rf spectrum. Measurements have been done with a laser beam power of 4.6 mW.
Figure 8B:
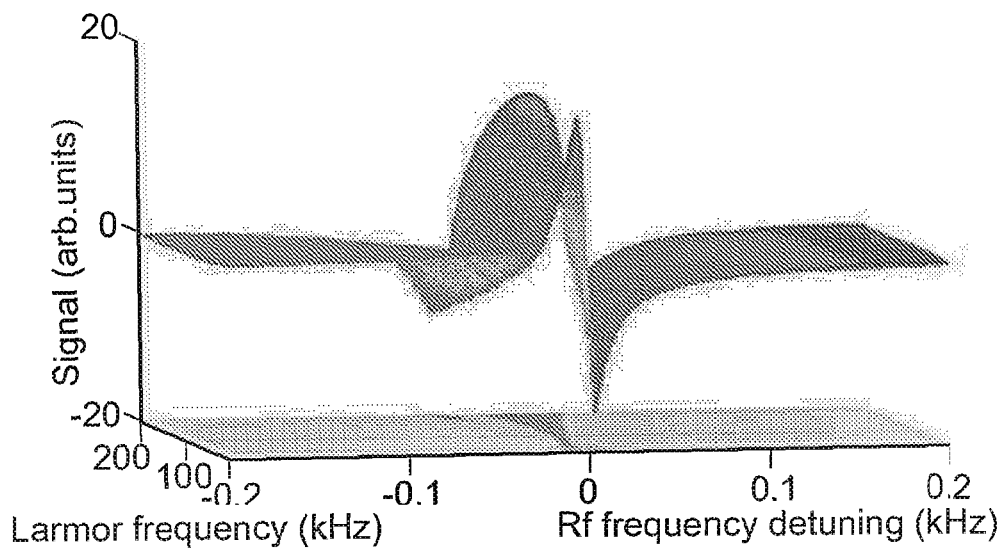

Accordingly, the beam 2 is detuned from a transition involving the first manifold of the ground state of the atomic energy levels of the atomic ensemble (in this embodiment the first manifold is $6^2S_{1/2}F=3$, the second manifold is $6^2S_{1/2}F=4$ and the beam 2 is detuned from the $6^2S_{1/2}F=3 \rightarrow 6^2P_{3/2}F'=4$ transition) such that a majority of the atomic population of the first manifold in the atomic ensemble is transferred from the first manifold to a magnetic Zeeman sublevel of the second manifold of the ground state. To maximize this effect, in this embodiment a frequency of the beam is a frequency which maximizes the magneto-optical-rotation signal from the second manifold, and this can in some embodiments be done automatically, although the skilled person will appreciate that frequencies around this maximum which still have an observable signal can be used. Reference is made to FIG. 5, discussed in detail below, which consists of about 700 rf spectra recorded for different detuning of the probe beam (with no pump) and shows the resonances for F=3 and F=4 marked with red and black arrows respectively. FIGS. 8a and 8b, also discussed below, is recorded in the same way (as a collection of rf spectra recorded for different Larmor frequencies). The detuning may range from about −416 MHz (for 3.3 mW) to about −290 MHz (for 10 mW) in this embodiment.

Furthermore, in this embodiment, the optical radiation power of the beam 2 exceeds a threshold power to cause asymmetry in the distribution of the atomic population of Zeeman sublevels of the second manifold so as to create a spin orientation. In this embodiment, the threshold power is 2 mW, although the threshold power for other embodiments may be different and will depend on the configuration of the atomic magnetometer, in particular on the atomic ensemble. The skilled person can determine an appropriate threshold power to use in any particular embodiment as it can be a power at which a dependence on optical radiation beam power of the magneto-optical-rotation signal of the atomic ensemble becomes non-linear.

The embodiment of FIG. 1 has the advantage that a linear rather than circularly polarized beam can create orientation in the atomic ensemble, meaning that the same beam can be used for probing the polarization. This can reduce the number of radiation sources that are needed. It can also result in smaller power consumption and smaller sensor dimensions.

In this embodiment, the beam 2 is negatively detuned from the transition involving the first manifold such that a majority of the atomic population of the first manifold in the atomic ensemble is transferred from the first manifold into a magnetic Zeeman sublevel of the second manifold with a maximum or minimum magnetic quantum number, which are the states with the highest momentum, otherwise referred to as stretched states of the second manifold. Negative detuning means that the frequency of the beam is reduced with respect to the frequency of the transition.

FIGS. 3a to 3c provide a schematic diagram showing the creation of orientation in the second manifold. Orientation is characterized by population pumped toward a Zeeman sublevel with high or low magnetic quantum number, preferably toward the Zeeman sublevel with maximum or minimum quantum number.

On the left hand side of FIG. 3a there is a schematic diagram of the energy levels of caesium.

FIG. 3b shows the result of detuned pumping at lower power, below the threshold power. FIG. 3c shows the result of detuned pumping at higher power, above the threshold power. For each of FIGS. 3b and 3c, the dashes show the Zeeman sublevels of the first (F=3) and second (F=4) manifolds and a dot on a dash shows population of that sublevel.

As can be seen, in FIG. 3b, below the threshold power, pumping has moved some of the atomic population of the first manifold into the second manifold, but there is alignment; there is a symmetrical population distribution in both the first and second manifolds.

As can be seen in FIG. 3c, with pumping above the threshold power, although there is still alignment in the first manifold, there is orientation in the second manifold as the second manifold population is substantially exclusively in a single stretched state.

In this embodiment, the atomic ensemble is caesium. However, caesium is not the only element that can be used. Nevertheless, the atomic ensemble is preferably an alkali metal, in particular caesium or rubidium.

As is clear from the above, in use the atomic magnetometer implements a method of generating atomic spin orientation in the atomic ensemble, including:

with the bias magnetic field source, providing a steady magnetic field, the bias magnetic field, to the atomic ensemble to cause a Zeeman splitting within first and second manifolds of the ground state of the atomic energy levels of the atomic ensemble;

with the radiation source 1, pumping the atomic ensemble with the electromagnetic optical radiation beam 2 to create an atomic spin orientation in the atomic ensemble.

While this is happening, the rf coil can be operated while adjacent to a sample in the manner discussed above to provide the primary magnetic field oscillating at rf frequency to cause the sample to produce the secondary magnetic field 4 oscillating at rf frequency.

The evolution of the collective atomic spin of the atomic ensemble, at least partially as a result of the secondary magnetic field 4, is mapped onto the polarization state of the beam 2, which is being used also as a magnetometer probe beam. In other words, pumping the ensemble with the beam is also probing the ensemble with the beam.

The detector detects the beam 2 after it has passed through the atomic ensemble in order to detect the oscillating secondary magnetic field 4 and in this embodiment so that material defect imaging can be performed.

Although the embodiment of FIG. 1 has the advantage of using a single beam 2, it is most effective at low Larmor frequency, typically no more than 30 kHz, in the range of 20 kHz to 30 kHz, in the range of 1 kHz to 30 kHz, or up to 20 kHz, and accordingly the bias magnetic field source is configured and operated to result in a Larmor frequency in the atomic ensemble within one of these ranges. However, the embodiment of FIG. 2, described below, is more effective than that from FIG. 1 but at the cost of increased complexity.

Figure 2:
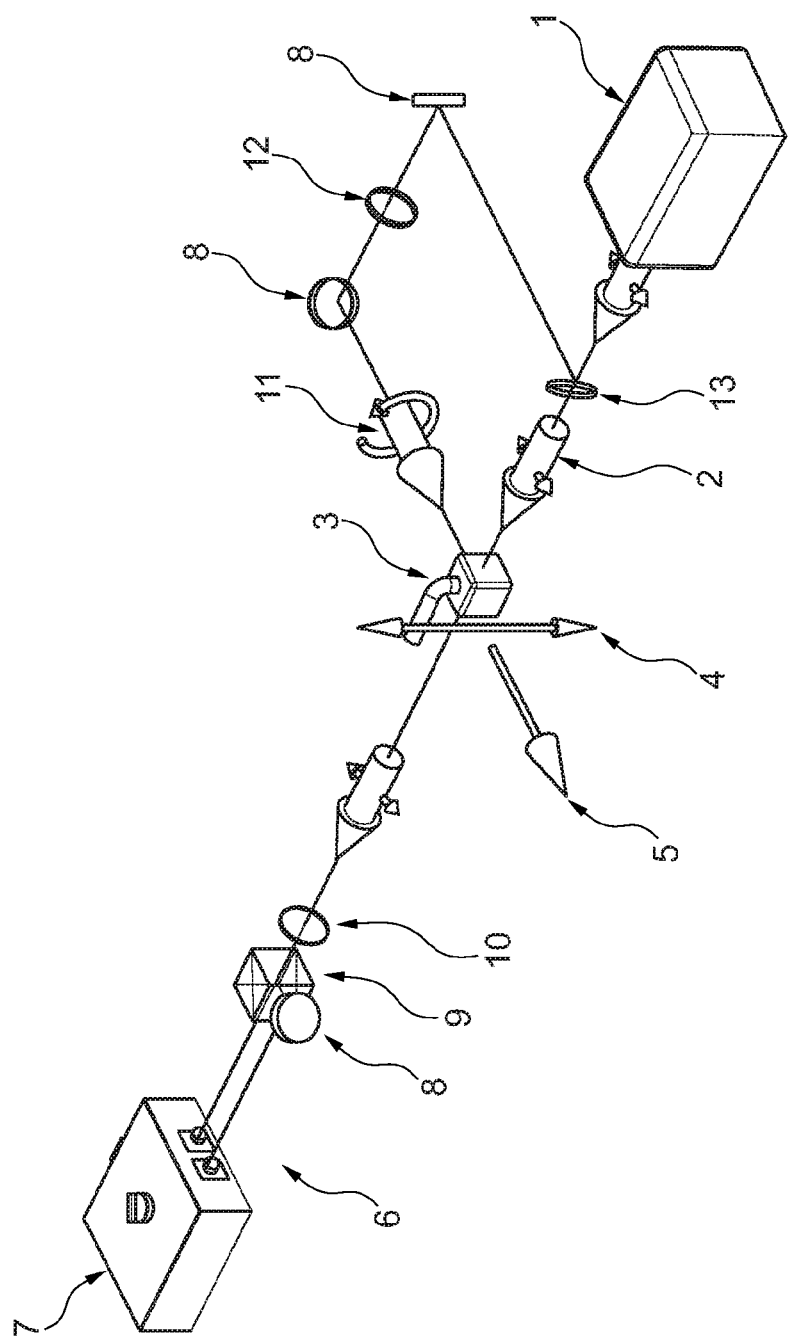
FIG. 2 shows a schematic configuration where a single beam is split in to two beams with a degenerate optical frequency. The linearly polarized beam acts in the same way as described in FIG. 1. The circularly polarized beam is used to enhance the population transfer between the ground state manifolds.

The embodiment of FIG. 2 is as per the embodiment of FIG. 1 except that it also uses a circularly polarized pump beam in the manner discussed below.

The magnetometer of FIG. 2 includes a beam splitter 13 configured to split a second beam from the linearly polarized beam 2 emitted by the radiation source 1. The linearly polarized beam 2 continues as described for FIG. 1, and the second beam is converted into a circularly polarized pump beam 11 and directed at and provided to the atomic ensemble in the detection cell, and is used to enhance the transfer, described above, of the atomic population from the first manifold into a magnetic Zeeman sublevel of the second manifold.

In this embodiment, the magnetometer is configured such that the probe beam has an optical radiation power above the threshold at the atomic ensemble.

However, since pumping is provided by the circularly polarized beam, it is not necessary in every embodiment for pumping to be provided by the linearly polarized beam. It is possible in some embodiments, for the power of the linearly polarized beam to be less than the threshold and for it not to assist with pumping.

Figure 13:
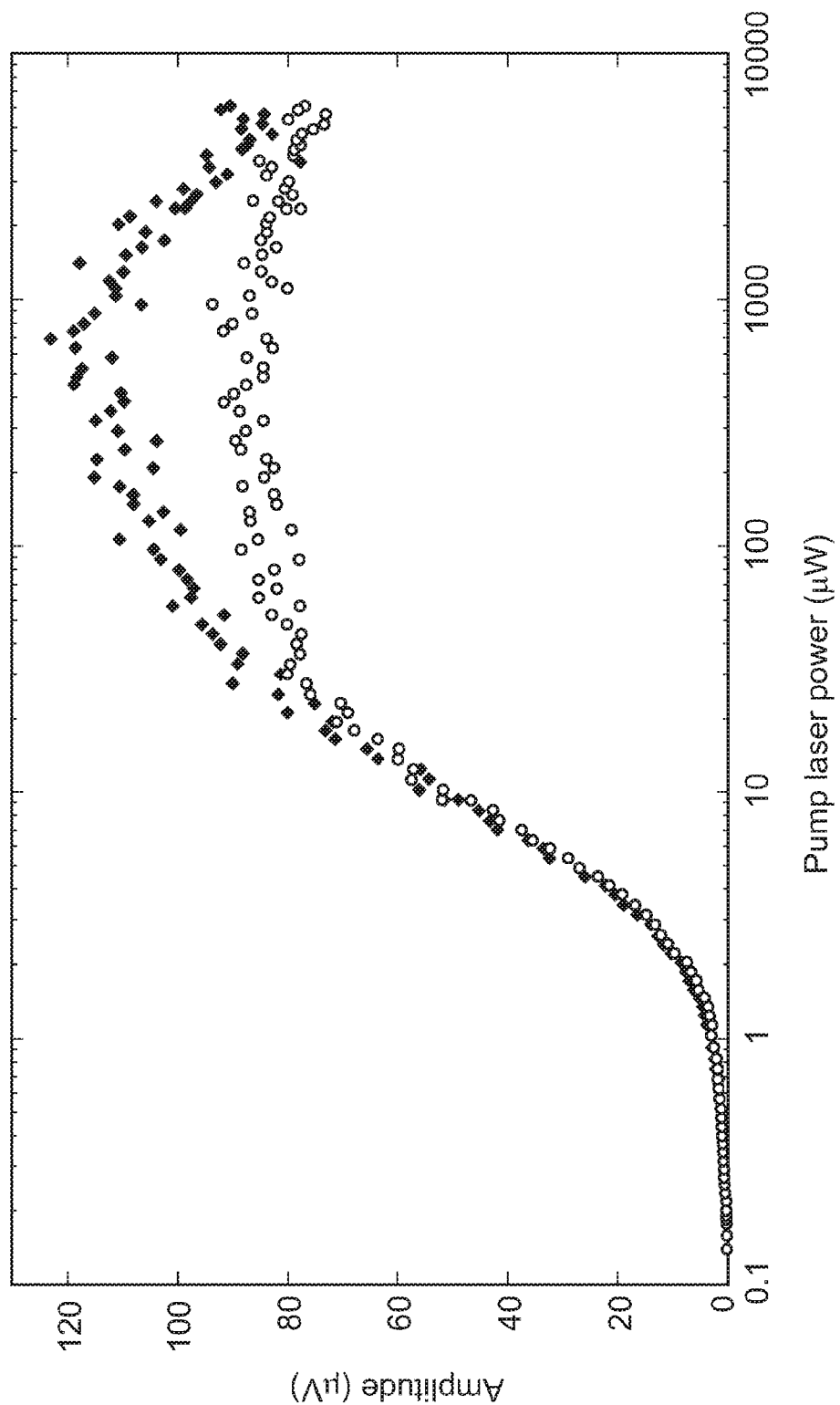
FIG. 13 is a plot showing the amplitude of the magnetometer vs. pump beam power for a circularly polarized beam.

With regard to the power of the circularly polarized pump beam, it is to be noted that the character of the polarization pumping by the pump and probe beam are different. Indirect pumping with the circularly polarized beam does not require high power, in fact the signal saturates around 200-500 µW and for even higher powers the amplitude of the signal decreases. Only the linearly polarized beam produces non-linearity. FIG. 13 is a plot showing the amplitude of the magnetometer vs. pump beam power (published in Appl. Phys. Lett. 2012). On the other hand, FIG. 7b (discussed below) shows that for given power of the pump beam the probe beam is able to increase the signal (polarization), as long as it is above threshold. Increase is marked by the change in steepness of the power dependence slope (blue).

Accordingly, the power of the pump beam in this embodiment is in the 200-500 µW range, although values outside this range can still be used in some embodiments.

In the embodiment of FIG. 2, the second beam is redirected via mirrors through a quarter-waveplate 12 to convert the linear polarization to circular polarization, and directed at the detection cell parallel to the bias field direction.

The circular polarization of the pump beam improves the effectiveness of the optical pumping. One result of this is that the system can be operated more effectively at higher Larmor frequencies. The bias magnetic field source is therefore in this embodiment configured and operated to result in a Larmor frequency in the atomic ensemble of greater than 20 kHz. However, the system is not restricted to operating at high Larmor frequencies and can be operated at lower Larmor frequencies, for example those of the embodiment of FIG. 1.

In the embodiment of FIG. 2, the pump beam provides increased pumping while the linearly polarized beam serves as a probe beam, although as explained above the linearly polarized beam in this embodiment also makes a contribution to pumping. As the skilled person will appreciate, the pump and probe beams are degenerate in terms of frequency. In this embodiment, the radiation source is configured to emit the beam with an optical radiation power in the region of from 6 mW to 7 mW, that is the combined power of the probe and pump beams. In other embodiments, this power can be greater, it can be up to 10 mW or above 10 mW.

In use, the embodiment of FIG. 2 operates and is operated in much the same way as that of FIG. 1. However, in this embodiment, the atomic ensemble is pumped with two beams, the probe beam and the pump beam, both of which make a contribution to pumping as discussed above.

As the skilled person will appreciate, instead of the radiation source emitting a single beam and the system splitting the beam as in the embodiment of FIG. 2, multiple radiation sources can be used, provided that the appropriate polarizations and similar frequencies are used, although this increases the cost and complexity of the system.

Furthermore, it is not necessary for the radiation source 1 to emit a linearly polarized beam, part of which is split off and converted into a circularly polarized beam. It could be performed the other way round, with the radiation source emitting a circularly polarized beam and part of it being split off and converted to a linearly polarized beam.

An advantage of the embodiment of FIG. 2 is that because the beams are detuned in the manner described, they are pumping the same type of symmetry (or lack of it). This means that the beams can be at the same frequency, in other words degenerate in terms of frequency, allowing a single radiation source to conveniently generate both. Without the detuning, the circularly polarized beam and the linearly polarized beam would compete, meaning different frequencies would need to be used to prevent this, as is often the case in conventional systems, meaning that multiple radiation sources would be needed.

In another embodiment, the system is configured and operated as described above in connection with FIG. 2. In this embodiment, the atomic ensemble is rubidium vapor and the radiation source is a Vertical-Cavity Surface-Emitting Laser diode (VCSEL). Rubidium can provide the functionality described with lower power laser diode than caesium, which advantageously allows a relatively low power VCSEL diode to be used. This is because the ground state hyperfine splitting in rubidium is about 3 or 6 GHz as compared to about 9 GHz in caesium. In this embodiment, the radiation source is configured to emit the beam with an optical radiation power of no more than about 4 mW, typically about 4 mW.

The skilled person will appreciate that the particular atomic magnetometer described above is not the only type of atomic magnetometer that can be used; for example, the detector can be varied but is preferably a photodetector that can detect the polarization and/or amplitude of the probe beam.

In some embodiments, it is possible to use the Earth's magnetic field as the bias field and therefore omit the bias magnetic field source.

Applications of the method and system described herein include the detection of corrosion under insulation, for example for oil and gas pipes and the energy sector, for monitoring re-enforced concrete structures for the transport sector, object detection, surveillance, and in nuclear waste vessels monitoring in nuclear power stations.

Advantages that may be obtained include that the system may be safe and non-invasive (non-ionising radiations), may be able to detect corrosion on the inner and/or outer wall of a pipeline, may be able to differentiate between corrosion and changes to pipeline geometries from bends/T-Junctions/welds in the pipe, may be able to scan through all insulation types, may be low cost, may be able to provide improvements in resolution and switch scanning-modes.

Although the main described embodiments relate to an atomic magnetometer, the system and/or method for generating an atomic spin orientation can be used in other areas such as for chemical analysis or the non-destructive testing of materials. In such embodiments, the detector may for example be omitted or modified as appropriate and the rf coil may be omitted.

Experimental Results and Discussion

Experimental results and discussion are presented below, which explore the mechanism of the generation of spin orientation in room-temperature Caesium vapor that combines three elements: (1) off-resonant optical pumping, (2) non-linear spin dynamics and (3) SEC (selective relaxation and coherence transfer). The details discussed below can of course be used in the embodiments described above.

Figure 4B:
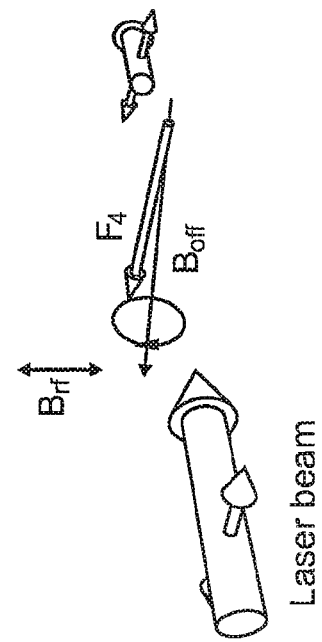
FIG. 4b is a schematic diagram depicting a weak radio-frequency field, $B_{rf}$, creating coherences between adjacent F=4 Zeeman sublevels, causing the atomic spin polarization to precess around $B_{off}$, marked with a black arrow. The spin precession is monitored by a linearly polarized probe beam.
Figure 4A:
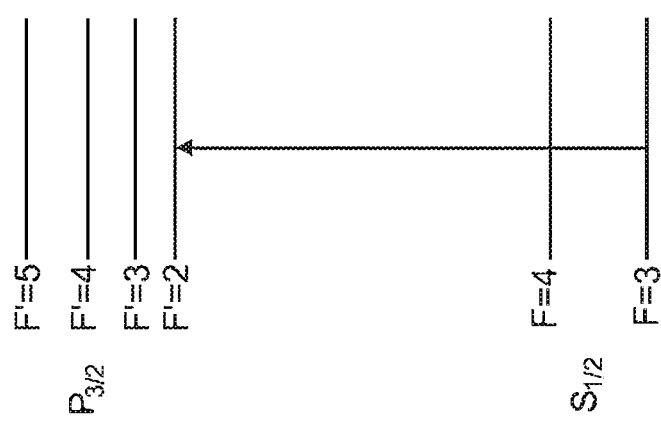
FIG. 4a is a schematic diagram depicting a linearly polarized laser beam transferring population between, and, creating a population imbalance (atomic spin) within the F=3 and F=4 caesium ground state manifolds.

(1) A linearly polarized laser beam moves the atomic population from the F=3 to F=4 manifold through off-resonant optical pumping, while creating a population imbalance (alignment) within both levels, FIG. 4a. The particular frequency detuning of the beam ensures that the majority of the population transferred to the F=4 level goes to either stretched states, i.e. sublevels with a maximum or minimum magnetic quantum number. While the dynamics within the F=3 level is defined by the resonant coupling to the laser field, the F=4 atomic spin evolves only in the presence of weak far-off resonant optical and SEC couplings.

(2) The weak coupling to the optical field drives the non-linear spin dynamics that breaks the population distribution symmetry. In particular, it moves some of the population out of one of the stretched states, effectively making the atoms more prone to SEC relaxation (3).

As a consequence of these two factors (non-linear spin dynamics and SEC), we observe suppression of components representing one of the spin directions that contributes to alignment and the generation of atomic orientation at low magnetic fields. The immediate implementation of the discussed technique is in the area of radio-frequency (rf) atomic magnetometry but possible applications cover a wide range of technologies from chemical analysis to the non-destructive testing of materials.

The following part contains a brief description of the experimental instrumentation. The components of the atomic spin orientation mechanism are explored through the dependencies of the rf spectroscopy signal on three measurement parameters (laser frequency detuning, beam power and magnetic field strength), which are discussed in the subsequent parts.

Experimental Setup.

Using a system according to FIG. 1, the measurements are performed in a shielded environment, although it is noted that this is not necessary for every embodiment.

The ambient magnetic field is suppressed by the use of five layers of cylindrical shields with end caps, made from 2-mm thick mu-metal. A solenoid inside the shield generates a well-controlled offset magnetic field, $B_{off}$, with a relative homogeneity exceeding $10^{-4}$ over the length of the cell. The atoms used are a Caesium atomic vapor housed in a paraffin-coated cell 3 at ambient temperature (atomic density $n_{Cs}$=0.33–1.0×$10^{11}$ cm$^{-3}$). These atoms are optically pumped by a linearly polarized laser beam 2, 20 mm in diameter, propagating orthogonally to the direction of $B_{off}$, FIG. 4b. The polarization of the beam 2 is parallel to $B_{off}$. The beam is provided by a DBR diode laser 1 operating on the caesium D2 line [FIG. 4a] and can be frequency stabilized within ±10 GHz with respect to the master laser frequency using offset locking. The same linearly polarized beam also acts as a probe of the polarization precession via the Faraday effect, where the evolution of the collective atomic spin is mapped onto the polarization state of the linearly polarized probe beam. The laser light transmitted through the cell is analyzed by a polarimeter 6 consisting of a crystal polarizer oriented at 45° with respect to the incident polarization and a commercial balanced photodetector 7. The two quadrature components of the resulting signal are measured by a lock-in amplifier, referenced to the first harmonic of the driving rf field ($B_{rf}$) frequency.

Off-Resonant Pumping.

Simple rate equations based on the transition probabilities of the D2 line confirm that the optimal condition (laser detuning) for population transfer between the F=3 to F=4 levels, and the generation of a population imbalance within the F=4 manifold are mutually exclusive. The former is optimized when the laser frequency is tuned in the vicinity of the $6^2S_{1/2}F=3 \rightarrow 6^2P_{3/2}F'=4$ transition, at which the latter effect is minimized. In the section below we identify the frequency range which optimizes the build-up of orientation in the F=4 level.

FIG. 5 shows the rf signal magnitude, $R=\sqrt{X^2+Y^2}$, where X and Y are the two quadrature components of the rf spectroscopy signal, as the frequency of the linearly polarised laser beam is scanned across the group of D2 line transitions involving the F=3 ground-state (zero detuning represents the $6^2S_{1/2}F=3 \rightarrow 6^2P_{3/2}F'=2$ transition). The relatively small amplitude of $B_{off}$ (Larmor frequency ~22 kHz) ensures that, on one hand, the contributions from both ground-state levels can be individually distinguished and, on the other, the Zeeman levels in a particular manifold are degenerate. The splitting between components of the F=3 spectral profiles is defined solely by the tensor light shift. In particular, as the laser frequency approaches the atomic resonance, the tensor light shift in F=3 increases, and consequently, so does the splitting between the components of the relevant profile. Due to the relatively large detuning from resonance, there is no significant splitting in the F=4 profile. Efficient pumping from the F=3 to the F=4 level, in the vicinity of the $6^2S_{1/2}F=3 \rightarrow 6^2P_{3/2}F'=4$ transition, results in the asymmetry in the F=3 signal amplitude with respect to the laser detuning. The exact detuning where the maximum in the F=4 signal is observed varies with the laser power and ranges from ~−416 MHz (3.3 mW) to ~−290 MHz (10 mW).

While the observation of off-resonant F=4 pumping is similar to that observed on the D1 transition, there are two differences worth pointing out. Firstly, the maximum pumping between the manifolds is reached for a non-zero laser detuning (~−310 MHz for the measurements represented in FIG. 5). Secondly, the character of the generated polarization within the F=3 (alignment) and F=4 (orientation) levels is different.

Non-Linear Dynamics.

The linearly polarized light ($\vec{E}_p$) couples to the atomic ground state through the tensor ac polarizability $\alpha_2$ (single-spin Hamiltonian, without the scalar part of the light shift $\sim \alpha_2 (\vec{E}_p \hat{I}^{(i)})^2$, where $\hat{I}^{(i)}$ is the total angular momentum operator of the i'th atom), therefore the atomic spin dynamics will in general exhibit a non-linear character.

Figure 6A:
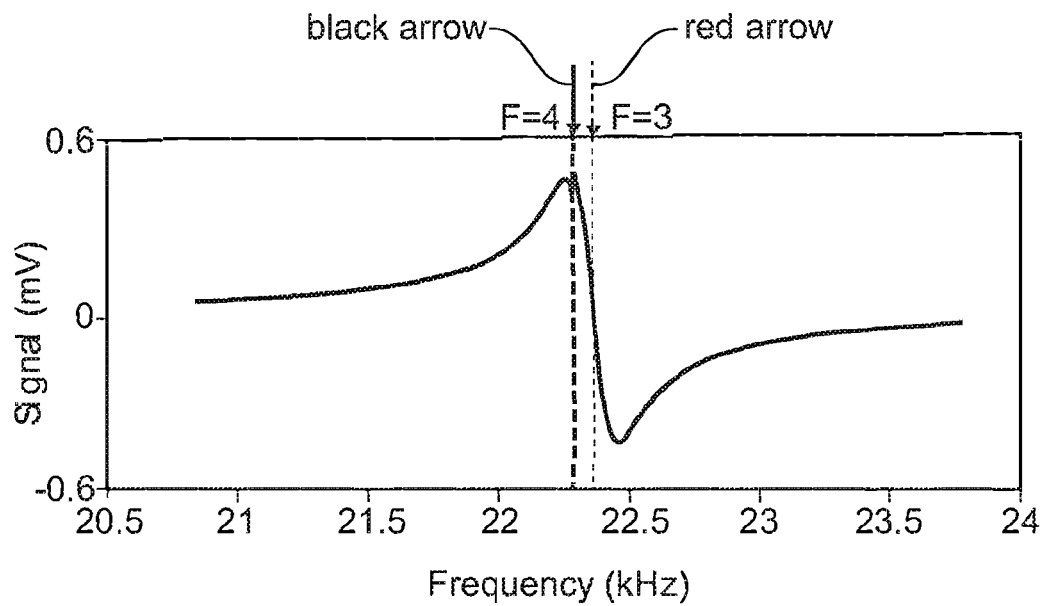
FIGS. 6a and 6b shows an rf spectroscopy signal recorded with the laser beam frequency tuned near the $6^2S_{1/2}F=3 \rightarrow 6^2P_{3/2}F'=2$ transition (detuning −100 MHz). The F=3 and F=4 resonances are marked with a red and black arrow respectively. Transition from alignment 6a to orientation 6b can be seen in the spectral profile created by the F=4 coherences. The measurements were performed with a laser beam power of 6a 200 μW and 6b 9.1 mW.
Figure 6B:
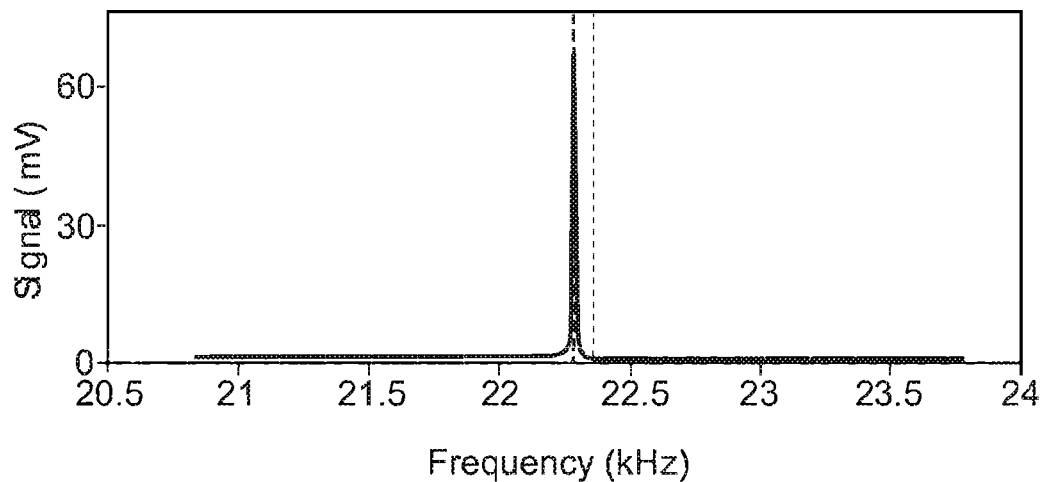

FIGS. 6a and 6b show the rf spectra recorded with a laser power of 200 µW (FIG. 6a) and 9.1 mW (FIG. 6b). The positions of the F=3 and F=4 resonances are marked with red and black arrows respectively. Polarization-rotation resonances are observed when the rf field frequency matches the splitting between neighboring Zeeman sublevels introduced by $B_{off}$. In an aligned system, the rf response consists of two profiles with an opposite sign, leading to a dispersive-like lineshape. At low power, FIG. 6a, the rf spectrum consists of a large broad feature due to alignment in the F=3 level created by direct optical pumping, with a much smaller structure due to off-resonant excitation into the F=4 manifold. An increase in the laser beam power does not only translate into an increase of the F=3 and F=4 signal amplitude, FIG. 6b. While the character of the F=3 profile remains unaltered, the change in the symmetry of the F=4 signal indicates the presence of atomic orientation. The resonant coupling of laser light to the F=3 Zeeman sublevels results in power broadening of their corresponding spectral profiles, which contributes to the broad low amplitude background visible in FIG. 6b.

Figure 7A:
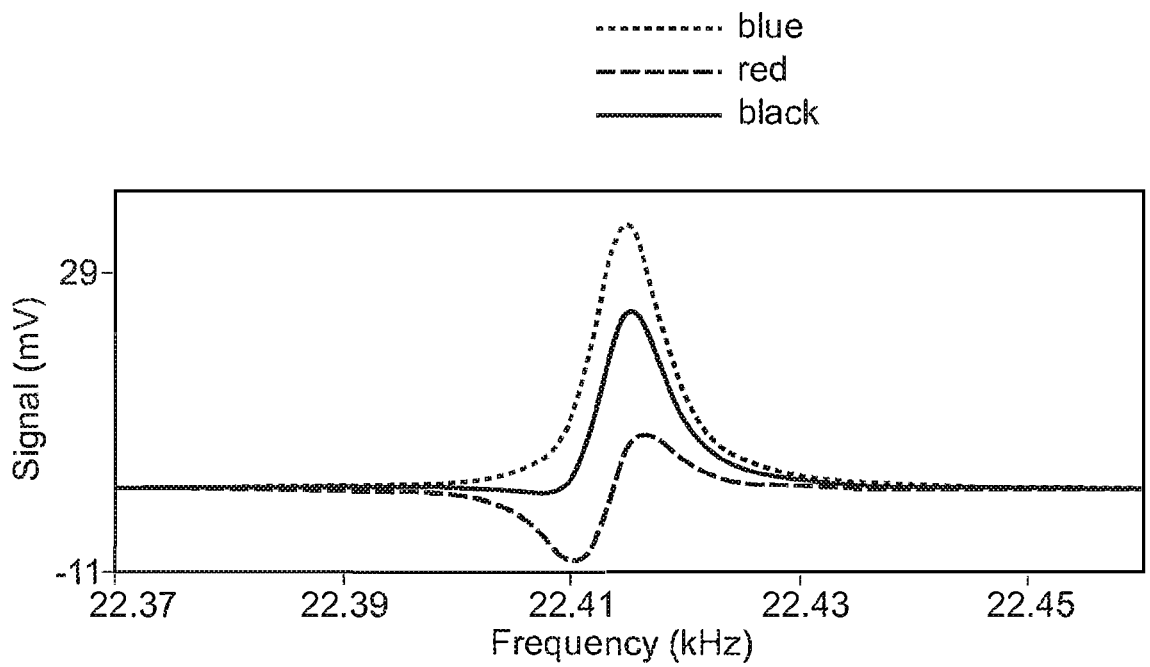
FIG. 7a shows a magneto-optical-rotation signal recorded with the linearly polarized beam only (solid black line), and in the presence of a circularly polarized pump beam with either orthogonal polarization components (dashed red and pointed blue lines). The linearly polarized beam power is 12.4 mW and the pump power is 17 μW.
Figure 7B:
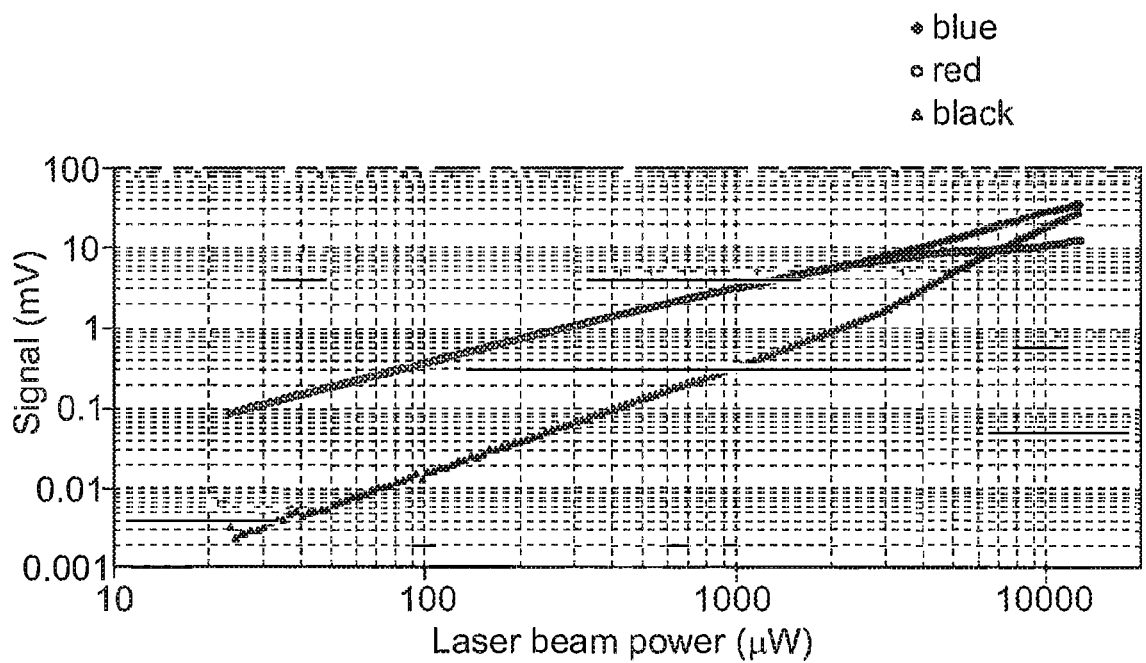
FIG. 7b shows dependence of the signal amplitude on the laser beam power for the linearly polarized beam only (black triangles) and combined with a circularly polarized beam parallel to $B_{off}$ (red points and blue diamonds represent the measurements with either of the two orthogonal circular polarizations for the pump beam).

To confirm that the F=4 spectral profile represents atomic orientation, pumping with a circularly polarized (pump) beam propagating along the direction of $B_{off}$ was added. The pump beam is generated by a diode laser, frequency locked to the Caesium $6^2S_{1/2}F=3 \rightarrow 6^2P_{3/2}F'=2$, 3 crossover. The solid black line in FIG. 7a shows the rf spectrum for the F=4 profile recorded with only the linearly polarized beam. The dashed red and pointed blue lines represent the case where one of the two orthogonal circular polarizations of the pump beam is added. The presence of the pump beam creates atomic orientation in the sample (parallel or anti-parallel to $B_{off}$). If the orientation generated by the linearly polarized beam and pump beam coincide, the amplitude of the observed profile increases [pointed blue line in FIG. 7a]. For the case with the opposite pump polarization, the signal amplitude decreases and the character of the spectrum changes (dashed red line). The dependencies of the signal amplitude for the opposite pump beam polarizations are shown (red points and blue diamonds) in FIG. 7b. The amplitudes of the signals created by the orthogonally polarized pump beams are equal below 2 mW of probe power. The asymmetry in amplitudes above this power is produced by the sample orientation induced by the linearly polarized beam.

The signature of this effect is also present in the amplitude data for the signal produced by only the linearly polarized beam (black triangles). The change from a linear to a quadratic slope in the amplitude power dependence, seen above 2 mW, confirms the non-linear character of the underlying mechanism. The calculations and the splitting of the spectrum in FIG. 6a indicates that the tensor light shift (0.2 Hz) is smaller than the SEC relaxation rate (3 Hz). However, even such a small value can trigger non-linear spin dynamics.

Spin-Exchange Collisions.

The effect of the non-linear spin dynamics is enhanced by SEC driven coherence transfer. It has been demonstrated that the degeneracy between the Zeeman sublevels transition frequencies leads to a decrease in the SEC dominated decoherence rate.

In contrast to the non-degenerate case, the frequency mismatch (dephasing) between precessing spins affected and not affected by SEC is negligible and the SEC processes, which do not involve manifold change, do not contribute to relaxation. One of the signatures of this effect, the so-called coherence transfer process, is that the spectral profiles representing the relevant coherences group around the leading component of the spectrum.

FIGS. 8a and 8b show the dependence of the two normalized quadratures (X, Y) of the if spectroscopy signal on $B_{off}$. The normalization takes into account the variation of the amplitude and phase of the rf spectroscopy signal with operating frequency and was performed in the standard pump-probe configuration over the same range of $B_{off}$. The spectral profile in FIG. 8a for large $B_{off}$ (Larmor frequency ~200 kHz) has a shape typical for atomic alignment, FIG. 8a. The decrease of $B_{off}$ increases the overlap of the components with opposite signs and consequently a reduction of the signal amplitude. Non-linear spin dynamics results in a decrease in the population of the stretched state represented in FIG. 8a by the profile positioned at ~-0.05 kHz detuning from resonance. This results in a higher relaxation rate for coherences contributing to the part of the spectrum with a negative detuning. Consequently, the amplitude of the component with a negative detuning decreases more rapidly with $B_{off}$ than the other profile. The small frequency mismatch between various components (decreasing with reduction of $B_{off}$) enhances coherence transfer and the build-up of atomic orientation observed over the frequency range below 20 kHz. For completeness, we show in FIG. 8b the evolution of the other quadrature component with the strength of $B_{off}$.

Conclusions. Radio-Frequency Atomic Magnetometer.

We have demonstrated the generation of atomic spin orientation in a room-temperature caesium vapor. The presence of atomic polarization is important for the operation of a radio-frequency atomic magnetometer. The if frequency range of the single beam technique (1 kHz-30 kHz) is interesting in the context of magnetic induction based non-destructive testing, where a low operating frequency translates into a deeper penetration depth of the (so-called primary) magnetic field. The measurement configuration discussed here combines the efficient generation of the F=4 atomic orientation and off-resonant probing usually achieved with two/three independent lasers. A clear benefit of the presented scheme is the simplicity of the instrumentation. Systematic measurements of the signal-to-noise ratio (SNR) confirm that the discussed option delivers a SNR only 1.3-1.4 times lower than recorded in the optimized pump-probe configuration. The relatively sharp peak in the signals frequency dependence, FIG. 5, allows for stabilization of the laser frequency despite strong saturation of the F=3 resonance.

As discussed above, a difficulty that the orientation generated by the linearly polarized beam is observed over a relatively narrow range of $B_{off}$ can be overcome through the implementation of a degenerate pump-probe configuration such as in the embodiment of FIG. 2, which involves a circularly polarized (pump) beam and a linearly polarized (probe) beam operating at the same frequency (for example ~290 MHz from the $6^2S_{1/2}F=3 \rightarrow 6^2P_{3/2}F'=2$ transition). It is worth pointing out that this frequency for the pump beam is not far from that used in the optimized indirect pumping scheme. The Caesium ground state hyperfine splitting (9.172 GHz) defines the detuning of the laser frequency from F=4, which affects the signal amplitude and non-linearity strength. Hence, the use of $^{85}$Rb vapor (hyperfine splitting of 3 GHz) can increase the recorded signal amplitudes. Tests indicate that the combination of a degenerate pump-probe and the use of $^{85}$Rb vapor can enable efficient operation of the atomic magnetometer with 4 mW of laser light power, which is achievable from a single Vertical-Cavity Surface-Emitting Laser diode.

All optional and preferred features and modifications of the described embodiments and dependent claims are usable in all aspects of the invention taught herein. Furthermore, the individual features of the dependent claims, as well as all optional and preferred features and modifications of the described embodiments are combinable and interchangeable with one another.

The invention claimed is:

1. A method of generating atomic spin orientation in an atomic ensemble, including:
   providing a steady magnetic field to the atomic ensemble to cause a Zeeman splitting within first and second manifolds of the ground state of the atomic energy levels of the atomic ensemble; and
   pumping the atomic ensemble with an electromagnetic optical radiation beam, the beam being detuned from a transition involving the first manifold such that a majority of the atomic population of the first manifold in the atomic ensemble is transferred from the first manifold into a magnetic Zeeman sublevel of the second manifold.

2. The method of claim 1, wherein the beam is detuned from a transition involving the first manifold such that a majority of the atomic population of the first manifold in the atomic ensemble is transferred from the first manifold into a magnetic Zeeman sublevel of the second manifold with a maximum or minimum magnetic quantum number.

3. The method of claim 1, wherein the optical radiation power of the beam exceeds a threshold power to cause asymmetry in the distribution of the atomic population of Zeeman sublevels of the second manifold so as to create an atomic spin orientation.

4. The method of claim 3, wherein the threshold power is a power at which a dependence on optical radiation beam power of a magneto-optical-rotation signal of the atomic ensemble becomes non-linear.

5. The method of claim 1, wherein the steady magnetic field is configured to result in a Larmor frequency in the atomic ensemble of no more than 20 kHz.

6. The method of claim 1, wherein a frequency of the beam is a frequency which maximizes a magneto-optical-rotation signal from the second manifold.

7. The method of claim 1, wherein the beam is negatively detuned from the transition involving the first manifold.

8. The method of claim 1, wherein the beam has linear polarization.

9. A method of detecting an oscillating magnetic field including the method of claim 8, including detecting the beam after it has passed through the atomic ensemble in order to detect an oscillating magnetic field.

10. The method of claim 1, wherein the beam has circular polarization.

11. The method of claim 10, wherein the steady magnetic field is configured to result in a Larmor frequency in the atomic ensemble of greater than 20 kHz.

12. A method of detecting an oscillating magnetic field including the method of claim 10, wherein the beam is a magnetometer pump beam, the method including probing the atomic ensemble with a magnetometer probe beam having linear polarization and being degenerate with the magnetometer pump beam in terms of frequency, the method including detecting the magnetometer probe beam after it has passed through the atomic ensemble in order to detect an oscillating magnetic field.

13. A system for generating an atomic spin orientation in an atomic ensemble, including:
   an atomic ensemble having atomic energy levels including a ground state including first and second manifolds; and
   a radiation source configured to pump the atomic ensemble with an electromagnetic optical radiation beam detuned from a transition involving the first manifold such that a majority of the atomic population of the first manifold in the atomic ensemble is transferred from the first manifold into a magnetic Zeeman sublevel of the second manifold.

14. The system of claim 13, wherein the system is configured to provide the beam with an optical radiation power exceeding a threshold power to cause asymmetry in the distribution of the atomic population of Zeeman sublevels of the second manifold so as to create an atomic spin orientation.

15. The system of claim 13, wherein the beam has linear polarization.

16. The system of claim 13, wherein the beam is a pump beam with circular polarization.

17. The system of claim 16, including a radiation source configured to probe the atomic ensemble with a linearly polarized probe beam substantially degenerate with the circularly polarized pump beam in terms of frequency.

18. The system of claim 17, wherein the radiation source is configured to emit a single beam and the system includes a beam splitter configured to split the single beam into the pump beam and the probe beam.

19. The system of claim 13, wherein the atomic ensemble is rubidium and the radiation source is configured to emit the beam with an optical radiation power of no more than 4 mW, wherein the radiation source is a Vertical-Cavity Surface-Emitting Laser diode.

20. The system of claim 13, including a magnetic field source configured to provide a steady magnetic field to the atomic ensemble to cause a Zeeman splitting within first and second manifolds of the ground state of the atomic energy levels of the atomic ensemble.

* * * * *